US009250679B2

(12) United States Patent
Park et al.

(10) Patent No.: US 9,250,679 B2
(45) Date of Patent: Feb. 2, 2016

(54) REDUCED WAKE UP DELAY FOR ON-DIE ROUTERS

(71) Applicant: Intel Corporation, Santa Clara, CA (US)

(72) Inventors: Dongkook Park, Santa Clara, CA (US); Akhilesh Kumar, Sunnyvale, CA (US); Donglai Dai, Pleasanton, CA (US)

(73) Assignee: INTEL CORPORATION, Santa Clara, CA (US)

(*) Notice: Subject to any disclaimer, the term of this patent is extended or adjusted under 35 U.S.C. 154(b) by 196 days.

(21) Appl. No.: 13/791,574

(22) Filed: Mar. 8, 2013

(65) Prior Publication Data

US 2014/0254588 A1 Sep. 11, 2014

(51) Int. Cl.
*H04L 12/28* (2006.01)
*G06F 1/32* (2006.01)
*H03K 19/00* (2006.01)
*H04J 1/16* (2006.01)

(52) U.S. Cl.
CPC ............ *G06F 1/3203* (2013.01); *G06F 1/3206* (2013.01); *G06F 1/3246* (2013.01); *G06F 1/3253* (2013.01); *H03K 19/0008* (2013.01); *Y02B 60/34* (2013.01)

(58) Field of Classification Search
USPC .................................. 370/252, 360, 369, 386
See application file for complete search history.

(56) References Cited

U.S. PATENT DOCUMENTS

| 5,729,720 | A | * | 3/1998 | Kau | ......................... | G06F 1/04 713/500 |
| 5,852,370 | A | * | 12/1998 | Ko | ..................... | H03K 19/0013 326/68 |
| 7,859,936 | B1 | * | 12/2010 | Vasudevan | ..................... | 365/227 |
| 8,738,860 | B1 | * | 5/2014 | Griffin et al. | ................. | 711/122 |
| 2011/0010525 | A1 | * | 1/2011 | Binkert et al. | .................. | 712/29 |
| 2014/0122833 | A1 | * | 5/2014 | Davis et al. | ..................... | 712/29 |

* cited by examiner

*Primary Examiner* — John Pezzlo
(74) *Attorney, Agent, or Firm* — Patent Capital Group

(57) ABSTRACT

Techniques for power gating. A first on-die router has an output port to receive data from a switching fabric. The output port is placed in a power-gated state if there is no activity in the output port for a current cycle and no messages are to be received by the output port during a subsequent cycle. A second on-die router has an input port coupled with the output port of the first on-die router. The input port is placed in a power-gated state if an input port buffer is empty and the output port is not active. Power-gating of the input port and the output port are independent of each other.

29 Claims, 6 Drawing Sheets

REDUCED WAKE UP DELAY FOR ON-DIE ROUTERS

TECHNICAL FIELD

Embodiments of the invention relate to power management in on-die routers. More particularly, embodiments of the invention relate to techniques for reduced wake up delay for on-die routers.

BACKGROUND

On-die routers are typically designed with a pipelined architecture and the general trend is to reduce the pipeline depth for better performance. However, when power gating is applied to a router design, the performance typically suffers due to wake up delay when the power-gated functional blocks in the router are being activated. In these short-pipeline routers the performance impact from the wake up delay can be significant.

Typical on-die router designs assume a specific number of cycles of wake up delay and designers attempt to minimize the impact on performance by managing the power gating frequency and wake up/shut down strategies. However, these approaches have tradeoffs between power savings and performance decrease, preventing optimal operation.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Described herein are power gating schemes with a zero-cycle wake up delay that may be used in on-die routers in, for example, multi-core chip architectures. This enables aggressive power gating with corresponding increased power savings without degrading performance. By separating power gating domains into two sub-domains (e.g., an input domain and an output domain) and by splitting link delay into two segments, the wake up delay can be effectively hidden, which can result in zero wake up delay impact on performance.

In various embodiments, an on-die router includes at least two power gating domains (e.g., one for one or more input ports and one for one or more output ports). The router pipeline may be modified such that the wake up signal can arrive at a downstream router one cycle before the data, which can result in effectively hiding the wake up delay. In one embodiment, power gating may be applied with port level granularity (as compared to router level granularity in previous designs) and input/output ports can be independently power gated. Each can have a different power gating strategy.

Unique fine-grained, port-level power gating techniques are described herein. In various embodiments, signaling is provided between routers that may be utilized to support power gating strategies. In one embodiment, the output port power gating technique utilizes a "shutdown_flag" signal that indicates if there are messages (flits) that are ready to be forwarded to the output port. In one embodiment, the input port power gating scheme utilizes a "buffer occupancy" signal at the current router and/or a "sleep" signal from the upstream router. Detailed timing and description of these signals is provided below.

Figure 1:
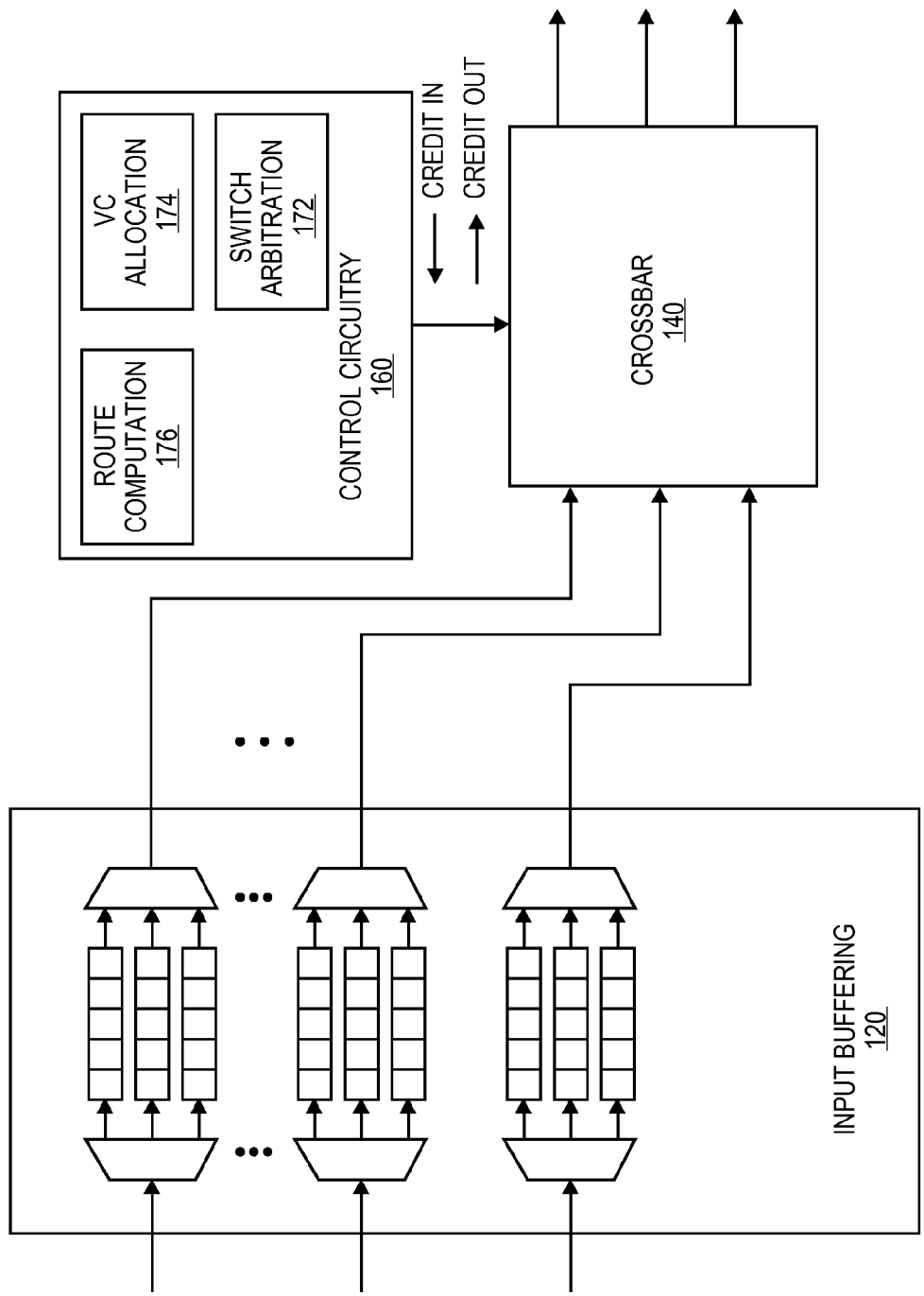
FIG. 1 is a block diagram of one embodiment of an on-die router architecture.

FIG. 1 is a block diagram of one embodiment of an on-die router architecture. Any number of routers may exist on a single die. For multi-core processor designs, two-dimensional mesh on-die interconnects provide better scalability than ring or bus-based interconnects while also providing better performance and lower power consumption.

FIG. 1 illustrates an on-die router having several functional blocks including buffers, routing computation logic, switch arbitration logic, virtual channel allocation logic, and a crossbar. These functional blocks operate in a pipelined manner. Input buffer 120 receives data from various sources, for example, bridge circuitry, memory, or other components. The data is buffered and sent to crossbar 140 that provides a switching fabric for routing data between the components of the system, for example, the bridge circuitry, memory, processors, or other components.

Control circuitry 160 operates to control crossbar 140 to route data within the system. Control circuitry 160 may utilize credits as part of managing crossbar 140. Control circuitry 160 includes switch arbitration agent 172 to manage switching of data, virtual channel (VC) allocation agent 174 to manage virtual channels and route computation agent 176 to mange data routing. Control circuitry 160 can also have additional agents and/or functionality.

Figure 2:
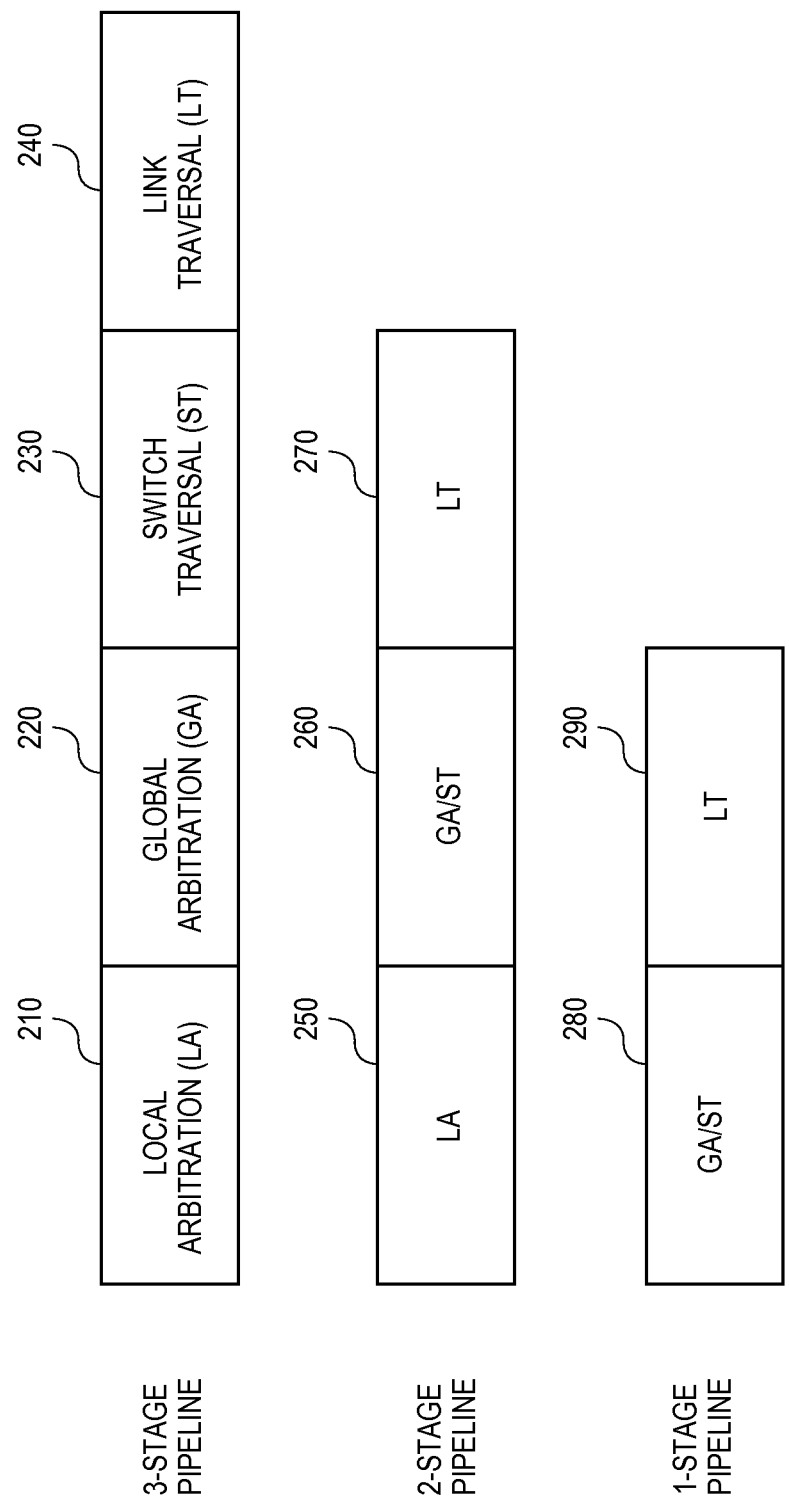
FIG. 2 illustrates various router pipeline configurations.

FIG. 2 illustrates various router pipeline configurations. The router pipeline configurations of FIG. 2 are applicable to the router architecture of FIG. 1. In one embodiment, the router is configurable to operate with a one-, two-, or three-stage pipeline.

The three-stage pipeline includes a stage for local arbitration (LA) 210, global arbitration (GA) 220, and switch traversal (ST) 230 followed by link traversal (LT) 240. The two-stage pipeline architecture has a stage for local arbitration (LA) 250, and global arbitration and/or switch traversal (GA/ST) 260 followed by link traversal (LT) 270. The one-stage pipeline architecture has a stage for global arbitration and/or switch traversal (GA/ST) 280 followed by link traversal (LT) 290.

To apply the zero-cycle wake up technique described herein, the general approach is to utilize retention registers to store current status information for logic, contents of flip flops and memory cells, for example, before powering down the larger functional blocks. When the functional blocks transition from being powered down, or wake up, previous status and data are restored from the retention register and/or other storage locations. This process can result in a "wake up delay" and, depending on the circuitry involved, operating clock frequency, and/or amount of data, can span multiple clock cycles.

For some system components having short pipelines (e.g., on-die routers), for example, those illustrated in FIG. 2, the power savings from traditional power gating may not be justified due to performance degradation caused by the wake up delay. To address this, a fine-grained power-gating scheme for on-die routers is described herein. In one embodiment, the major functional blocks are grouped in two power-gating domains: 1) the input port domain; and 2) the output port domain.

In one embodiment, the input port domain includes input buffers (e.g., 120), routing computation logic (e.g., route computation agent 176) and local arbitration logic (e.g., part of switch arbitration 172). In one embodiment, the output port domain includes the crossbar (e.g., crossbar 140) or other switching fabric, global arbitration logic (e.g., part of switch arbitration 172) and link drivers.

Each power-gating domain can utilize an independent strategy. For example, in a router that has multiple sets of input-output port pairs, each port can be power gated independently. This provides a more efficient and more flexible power gating strategy than previously available.

Figure 3:
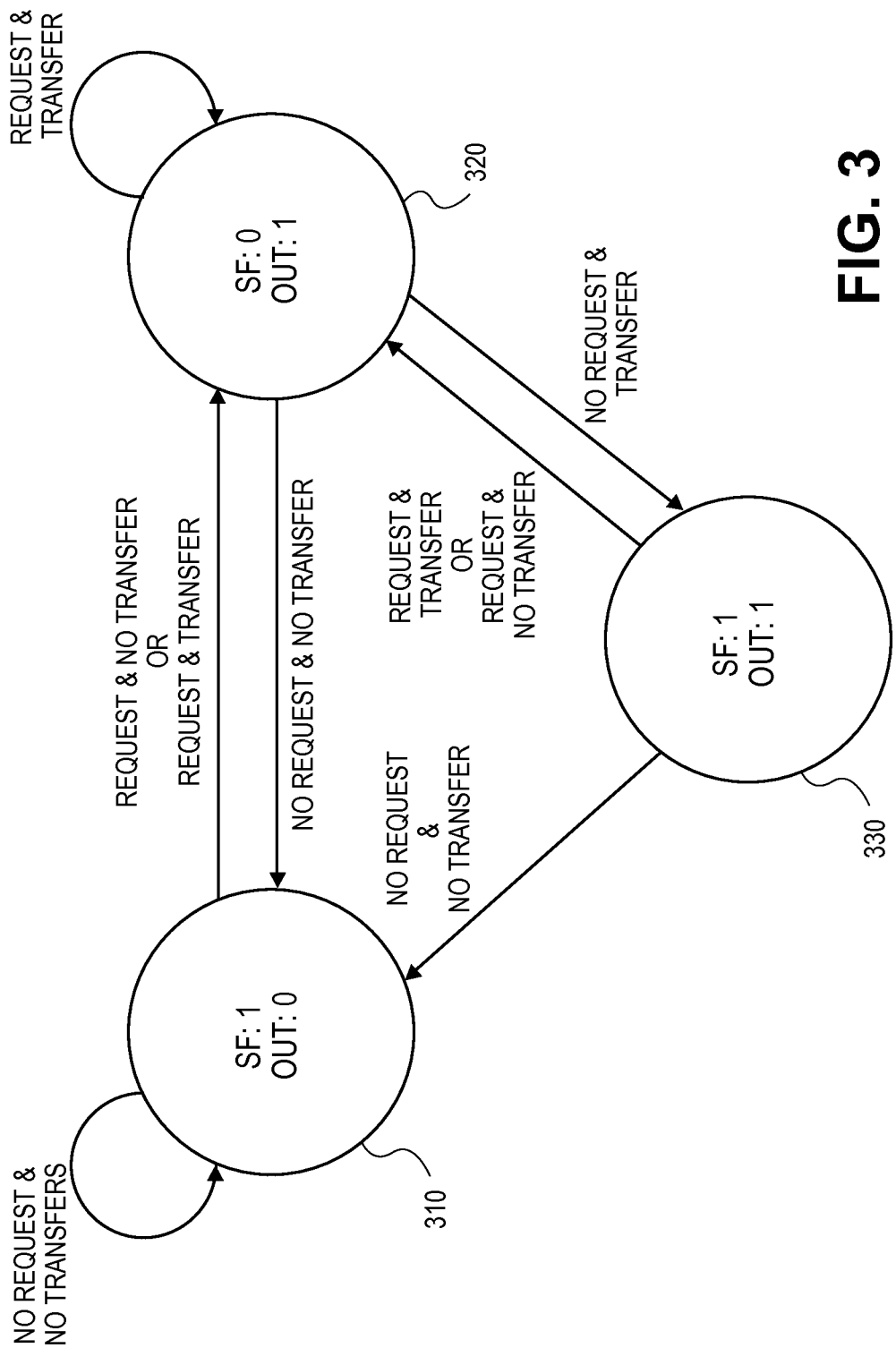
FIG. 3 is a state diagram of is a state diagram of one embodiment of an output port power-gating strategy.

FIG. 3 is a state diagram of is a state diagram of one embodiment of an output port power-gating strategy. In one embodiment, each output port can power gate itself when 1) there is no activity in that port for the current cycle, and 2) no other messages (flits) are expected to be sent to that port for the next cycle.

Previous power gating schemes utilize prediction techniques and have a grace period before power gating logic blocks to minimize the impact from the wakeup delay. However, as described herein, the wakeup delay can be hidden causing no delay and thus, the logic block can be power gated when the two conditions above are met.

In one embodiment, to monitor these conditions, the following signals are used. The "out_active" (OUT) signal is set when there is activity (e.g., a message/flit being transferred through the crossbar) in the output port. The "shutdown_flag" (SF) signal is set when there are no local arbitration winners in the input ports requesting the output port (i.e., no messages/flits are expected at the output port on the next cycle). The output port wakes from the power-gated state when the SF signal switches to indicate a message/flit is expected.

In state 310, the output port is power gated. The output port stays in state 310 if there is no request and no transfers. That is, if the two conditions above are met. The output port transitions from state 310 to state 320 in which the output port is not power gated if there is a request (i.e., request and no transfer), which is normal pipeline operation or if there is a request and a transfer, which is a bypass operation. The output port transitions from state 320 to state 310 if the output port has changed which would result in no transfers and no requests. This is a relatively rare situation. In state 320 the output port is not power gated.

The output port transitions from state 320 to state 330 if there is no request and there is an active transfer. In state 330 the output port is not power gated. The output port transfers from state 330 to state 320 if there is a request and a transfer or if there is a request and no transfer. The output port transitions from state 330 to state 310 if there is no request and no transfer. The output port can then be power gated.

Figure 4:
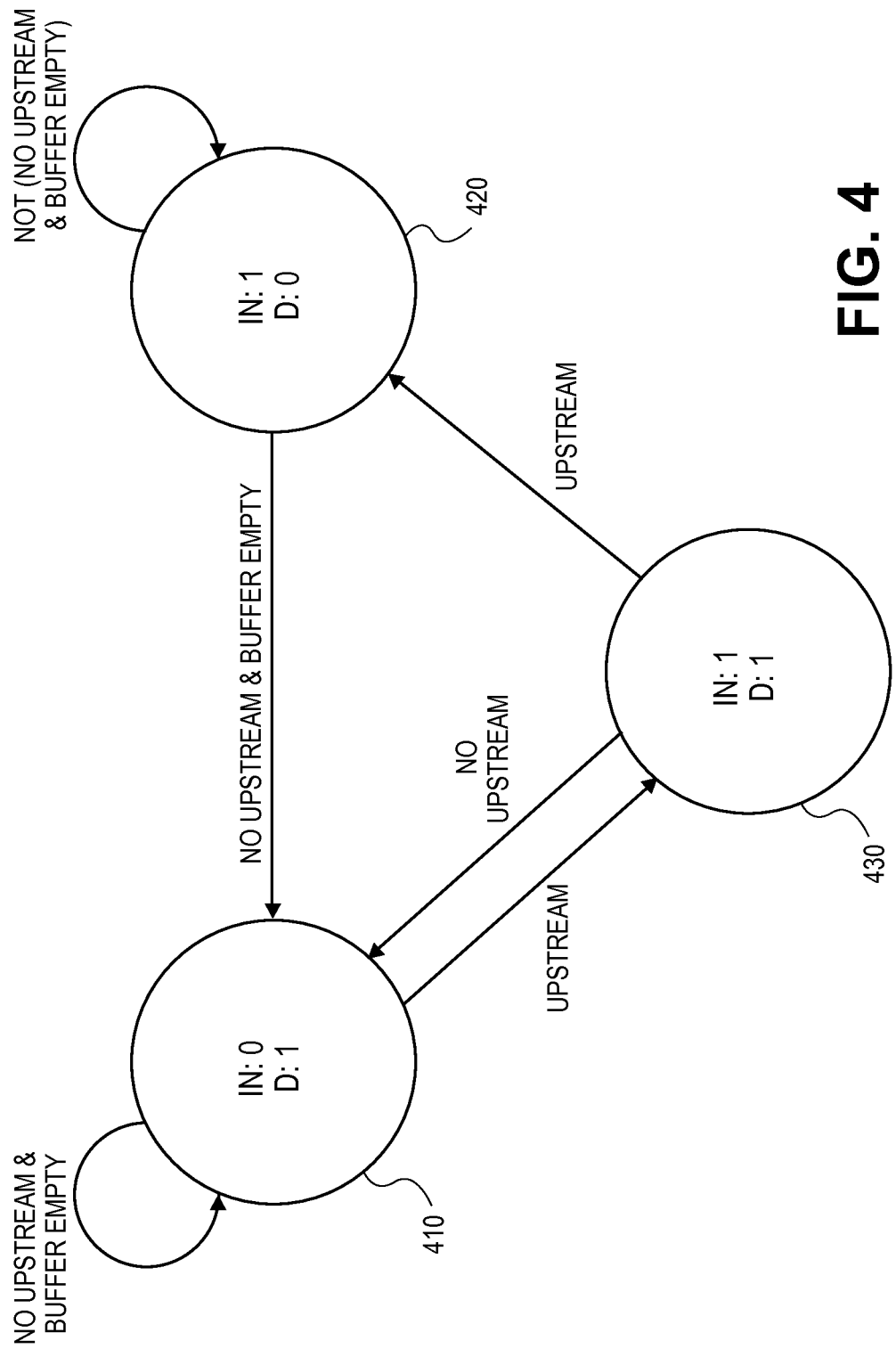
FIG. 4 is a state diagram of is a state diagram of one embodiment of an input port power-gating strategy.

FIG. 4 is a state diagram of is a state diagram of one embodiment of an input port power-gating strategy. In one embodiment, each input port can power gate itself when 1) the buffer is empty, and 2) the upstream router's output port is not active (e.g., out_active (OUT) signal is zero).

In one embodiment, to monitor these conditions, the following signals are used. The "in_active" (IN) signal is set when there is activity (e.g., a buffer read/write) in the input port. The "wakeup_delay" (D) signal is set to the number of cycles (e.g., 1 cycle, 2 cycles, 3 cycles) when the upstream router's output port wakes from the power-gated status (e.g., OUT changes from 0 to 1) to initiate the wake up process of the input port. The value is decreased for each cycle until it becomes zero, which indicates that the input port is awake and ready to receive messages/flits.

In state 410, the input port is power gated. The input port stays in state 410 if there is no upstream router activity and the buffer is empty. That is, if the two conditions above are met. The input port transitions from state 410 to state 430 in which the input port is not power gated if there is activity in the upstream router. The output port transitions from state 430 to state 410 if the input port has changed. This is a relatively rare situation. In state 430 the output port is not power gated.

The input port transitions from state 430 to state 420 if there is upstream router activity. In state 420 the input port is not power gated. The input port transfers from state 420 to state 410 if there is no upstream router activity and the buffer is empty. The input port stays in state 420 as long as there is upstream router activity and the buffer is not empty.

Figure 5:
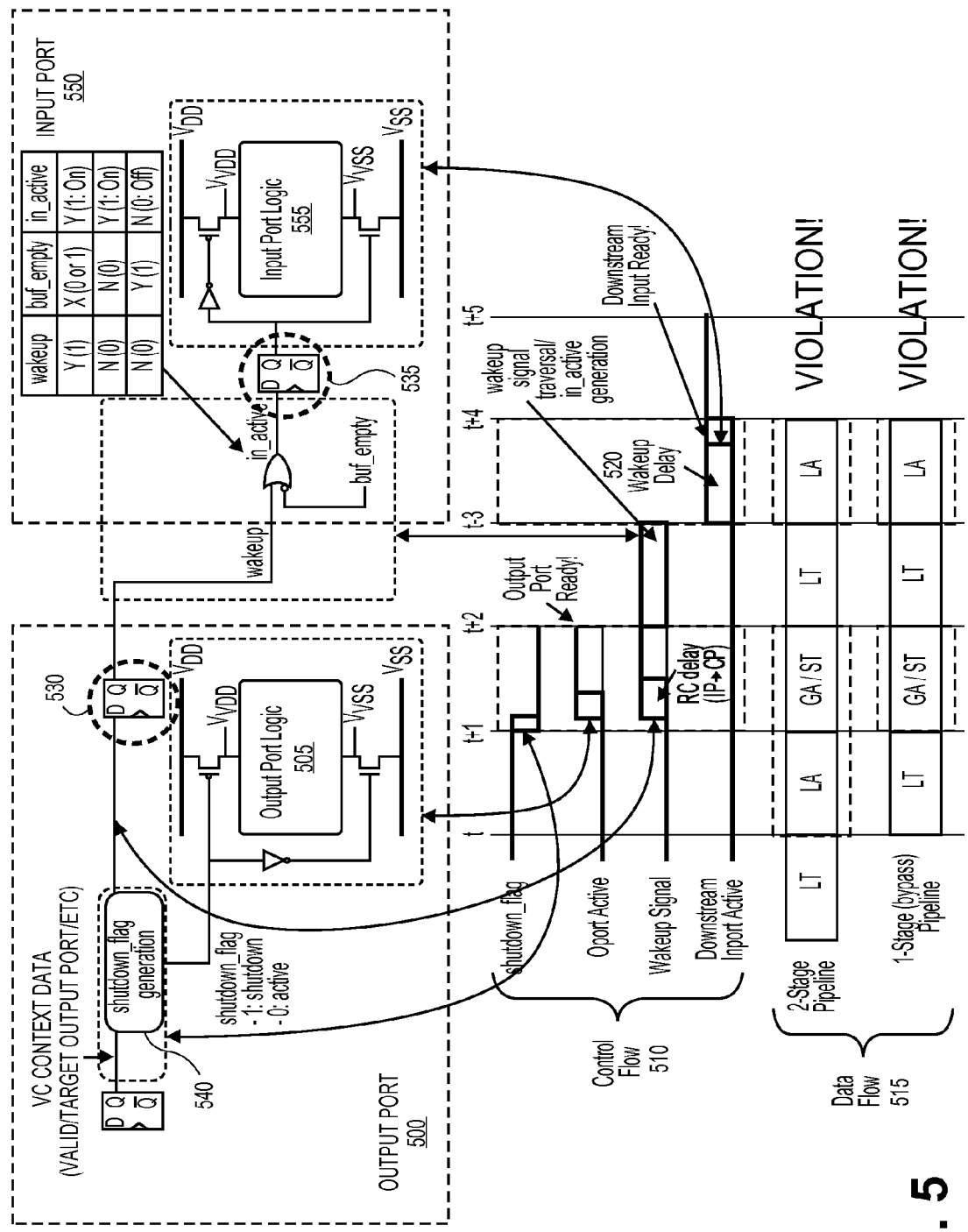
FIG. 5 is a block diagram of one embodiment of an on-die router utilizing a previous wakeup mechanism.

FIG. 5 is a block diagram of one embodiment of an on-die router utilizing a previous wakeup mechanism. FIG. 5 illustrates a typical wakeup scenario and provides detailed timing information. Output port 500 is an upstream port for input port 550, which may be a part two routers located on the same die. In another embodiment, output port 500 and input port 550 may be on separate dies within a single package connected, for example, an on-package input/output (OPIO) interface.

In the example of FIG. 5, the critical control path timing (including the four signals discussed above) are included in control flow 510 and the critical data path is shown in data flow 515 for both one-stage and two-stage pipelines, as illustrated in FIG. 2. Control flow 510 illustrates the latency caused by the various elements illustrated in FIG. 5.

The shutdown_flag signal illustrates transitions in the signal generated by shutdown_flag generation circuit 540. The Output Port signal illustrates the state of output port logic 505 in response to the output port signals described above. The wakeup signal illustrates the state of the wakeup signal from flip-flop 530 in response to the shutdown_flag signal. The Downstream Input Port Active signal illustrates the state of input port 550 in response to the input port signals described above. The wakeup delay is the time required for input port logic 555 to activate in response to the in_active signal.

In this example, because the wakeup signal is sent to the downstream router (input port 550) during the same cycle the data is sent, at best, the one-cycle wakeup delay 520 cannot be hidden and the latency is included in the wakeup process. The result is that the message/flit will be blocked for at least a cycle before it can be sent because it must wait for the downstream port (i.e., input port 550) to be ready.

The techniques described herein allows the number of flip-flops (530, 535) along the wakeup control signal path (including shutdown_flag generation circuit 540) from two (in FIG. 5) to one (in FIG. 6) with the single flip-flop being placed between the routers, as discussed in greater detail below. Using this architecture, the available timing on both ends can be fully utilized and, depending on the actual wakeup time of the downstream input port, the wakeup delay can be completely hidden.

As described above, the wakeup process typically involves reading data back from a retention register because the input buffer was empty when the buffer is power-gated. Also, the control logic can be reinitialized to default values (instead of restoring previous values). If some logic values need to be retained (e.g., priority information of the arbiter logic), that logic can be maintained always on so that the data is not lost during power gating. Leakage power consumption by this type of control logic is typically much less than the leakage power consumed by the major blocks, for example, the crossbar or buffers. Thus, leaving some logic always on can have minimal impact on overall power savings while significantly improving timing. Use of faster metal layers for wakeup signal transfer can also help.

Figure 6:
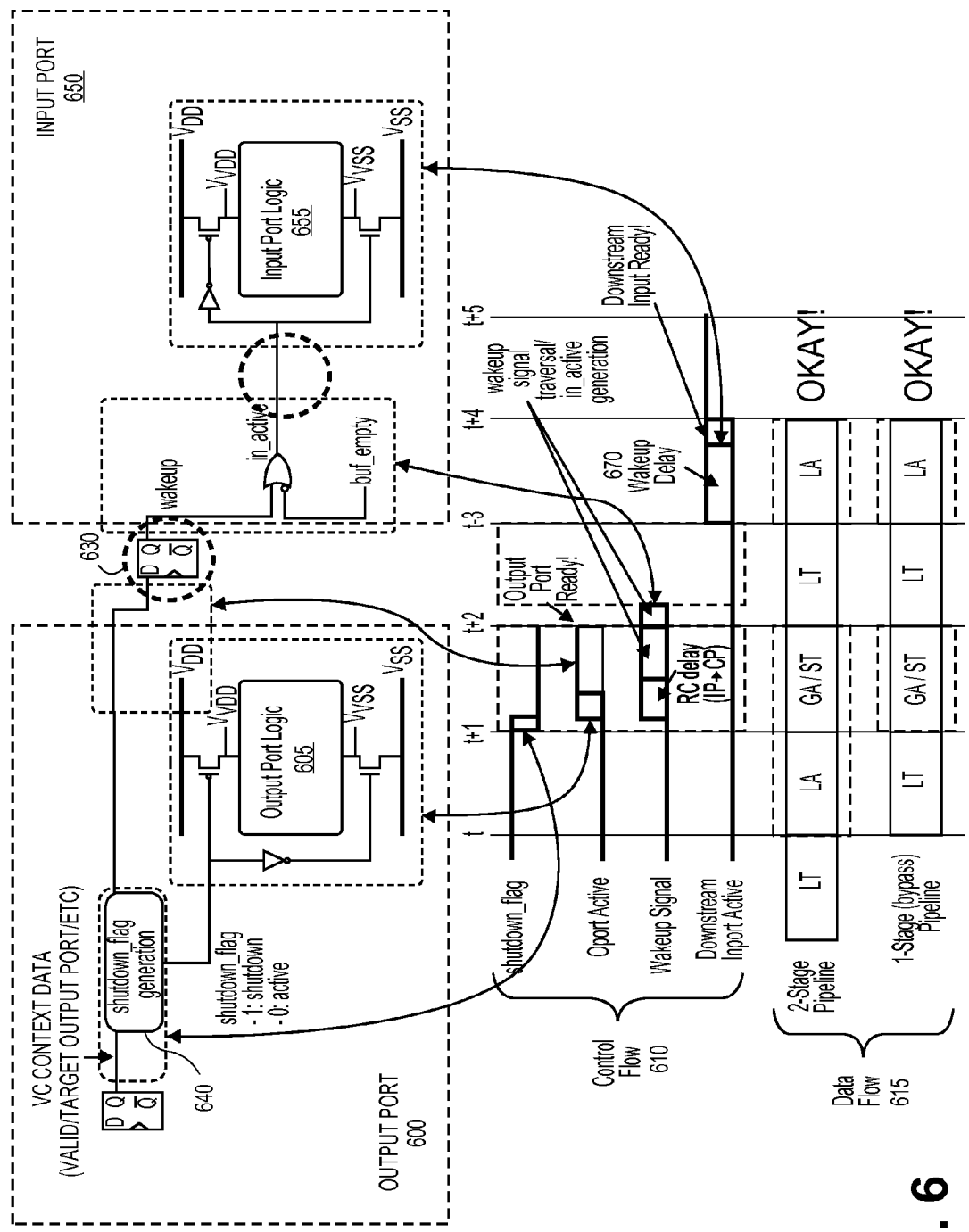
FIG. 6 is a block diagram of one embodiment of an on-die router utilizing a wakeup mechanism that can hide wakeup latency.

FIG. 6 is a block diagram of one embodiment of an on-die router utilizing a wakeup mechanism that can hide wakeup latency. FIG. 6 provides an example embodiment in which the wakeup signal can be sent early enough that the input port can be ready when the data arrives, thus hiding the wakeup delay.

In the example of FIG. 6, the critical control path timing (including the four signals discussed above) are included in control flow 610 and the critical data path is shown in data flow 615 for both one-stage and two-stage pipelines, as illustrated in FIG. 2. Control flow 610 illustrates the latency caused by the various elements illustrated in FIG. 6.

The shutdown_flag signal illustrates transitions in the signal generated by shutdown_flag generation circuit 640. The Output Port signal illustrates the state of output port logic 605 in response to the output port signals described above. The wakeup signal illustrates the state of the wakeup signal from flip-flop 630 in response to the shutdown_flag signal. In the embodiment of FIG. 6, flip-flop 630 latches the shutdown flag signal from shutdown_flag generation circuit 640 in output port 600 to input port 650.

The Downstream Input Port Active signal illustrates the state of input port 650 in response to the input port signals described above. The wakeup delay is the time required for input port logic 655 to activate in response to the in_active signal. By utilizing the architecture of FIG. 6, the wakeup delay for input port 650 can be hidden in the pipeline effectively giving a zero-cycle wakeup for input port 650.

In one embodiment, a faster metal layer (e.g., with a wider pitch) can be used to transmit one or more wakeup signals to reduce latency associated with those signals. The architecture of FIG. 6 allows wakeup delay 670 to occur during the link traversal stage (as compared to the local arbitration stage), which effectively hides wake up delay 670 in the control flow and eliminates the need for any delay before beginning local arbitration caused by data received by input port 650.

In one embodiment, an apparatus for reduced wakeup delay in on-die routers includes a first on-die router having an output port coupled to receive data from a switching fabric. The output port is placed in a power-gated state if there is no activity in the output port for a current cycle and no messages are to be received by the output port during a subsequent cycle. The apparatus also includes a second on-die router having an input port coupled with the output port of the first on-die router. The input port is placed in a power-gated state if an input port buffer is empty and the output port is not active. Power-gating of the input port and the output port are independent of each other.

In one embodiment, no activity in the output port for the current cycle means no activity in the switching fabric for the output port. In one embodiment, no messages are to be received by the output port during a subsequent cycle means determining that there are no arbitration wining ports requesting the output port.

In one embodiment, the input buffer being empty means determining if there is activity in a read buffer for the input port. In one embodiment, the input buffer being empty means determining if there is activity in a write buffer for the input port.

In one embodiment, determining the output port is not active means counting a number of cycles from a wakeup signal, where the number corresponds to an amount of time for the input port to transition out of the power-gated state. In one embodiment, the switching fabric is a crossbar.

In one embodiment, a method for power-gating an input port and an output port independently of each other is provided. The input port is coupled to receive data from the output port. The output port is placed in a power-gated state if there is no activity in the output port for a current cycle and no messages are to be received by the output port during a subsequent cycle. The input port is placed in a power-gated state if an input port buffer is empty and the output port is not active.

In one embodiment, the input buffer being empty means determining if there is activity in a read buffer for the input port. In one embodiment, the input buffer being empty means determining if there is activity in a write buffer for the input port.

In one embodiment, determining the output port is not active means counting a number of cycles from a wakeup signal, where the number corresponds to an amount of time for the input port to transition out of the power-gated state. In one embodiment, the switching fabric is a crossbar.

In one embodiment, a system having reduced wakeup delay in on-die routers includes a first on-die router having an output port coupled to receive data from a switching fabric. The output port is placed in a power-gated state if there is no activity in the output port for a current cycle and no messages are to be received by the output port during a subsequent cycle. The apparatus also includes a second on-die router having an input port coupled with the output port of the first on-die router. The input port is placed in a power-gated state if an input port buffer is empty and the output port is not active. Power-gating of the input port and the output port are independent of each other. The system includes register files (RF).

In one embodiment, the input buffer being empty means determining if there is activity in a read buffer for the input port. In one embodiment, the input buffer being empty means determining if there is activity in a write buffer for the input port.

In one embodiment, determining the output port is not active means counting a number of cycles from a wakeup signal, where the number corresponds to an amount of time for the input port to transition out of the power-gated state. In one embodiment, the switching fabric is a crossbar.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a first on-die router having an output port coupled to receive data from a switching fabric, wherein the output port is to be in a powered down state based on an identification that there is no activity in the output port for a current cycle and that no messages are to be received by the output port during a subsequent cycle;

a second on-die router having an input port coupled with the output port of the first on-die router, wherein the input port is to be in a powered down state based on an identification that a corresponding input port buffer is empty and the output port is not active;

wherein power-gating of the input port and the output port are independent of each other.

2. The apparatus of claim 1 wherein no activity in the output port for the current cycle comprises no activity in the switching fabric for the output port.

3. The apparatus of claim 1 wherein no messages are to be received by the output port during a subsequent cycle comprises determining that there are no arbitration wining ports requesting the output port.

4. The apparatus of claim 1 wherein the input buffer being empty comprises determining if there is activity in a read buffer for the input port.

5. The apparatus of claim 1 wherein the input buffer being empty comprises determining if there is activity in a write buffer for the input port.

6. The apparatus of claim 1 wherein determining the output port is not active comprises counting a number of cycles from a wakeup signal, wherein the number corresponds to an amount of time for the input port to transition out of the powered down state.

7. The apparatus of claim 1 wherein the switching fabric comprises a crossbar.

8. A method for power-gating an input port domain and an output port domain of an on-die router independently of each other, the input port coupled to receive data from the output port, the method comprising:

placing the output port in a powered down state based on a determination that there is no activity in the output port for a current cycle and that no messages are to be received by the output port during a subsequent cycle; and placing the input port in a power-gated state based on a determination that an input port buffer is empty and that the output port is not active.

9. The method of claim 8 wherein no activity in the output port for the current cycle comprises no activity in a switching fabric for the output port.

10. The method of claim 8 wherein no messages are to be received by the output port during a subsequent cycle comprises determining that there are no arbitration wining ports requesting the output port.

11. The method of claim 8 wherein the input buffer being empty comprises determining if there is activity in a read buffer for the input port.

12. The method of claim 8 wherein the input buffer being empty comprises determining if there is activity in a write buffer for the input port.

13. The method of claim 8 wherein determining the output port is not active comprises counting a number of cycles from a wakeup signal, wherein the number corresponds to an amount of time for the input port to transition out of the power-gated state.

14. The method of claim 8 wherein the switching fabric comprises a crossbar.

15. A system comprising:

a dynamic random access memory (DRAM) device;

a first on-die router coupled with the DRAM device through at least an input buffer, first on-die router having an output port coupled to receive data from a crossbar circuit, wherein the output port is placed in a powered down state if there is no activity in the output port for a current cycle and no messages are to be received by the output port during a subsequent cycle;

a second on-die router having an input port coupled with the output port of the first on-die router, wherein the input port is placed in a powered down state if an input port buffer is empty and the output port is not active;

wherein power-gating of the input port and the output port are independent of each other.

16. The system of claim 15 wherein no activity in the output port for the current cycle comprises no activity in the switching fabric for the output port.

17. The system of claim 15 wherein no messages are to be received by the output port during a subsequent cycle comprises determining that there are no arbitration wining ports requesting the output port.

18. The system of claim 15 wherein the input buffer being empty comprises determining if there is activity in a read buffer for the input port.

19. The system of claim 15 wherein the input buffer being empty comprises determining if there is activity in a write buffer for the input port.

20. The system of claim 15 wherein determining the output port is not active comprises counting a number of cycles from a wakeup signal, wherein the number corresponds to an amount of time for the input port to transition out of the powered down state.

21. An apparatus comprising:

on-die router logic coupled to a plurality of agents, the on-die router logic to include a plurality of functional blocks, wherein the plurality of functional blocks are grouped into a first power domain and a second power domain, the first power domain comprises an output port and the second power domain comprises an input port coupled with the output port, the first power domain is to be power gated to a powered down state based on detection of no activity in the output port for a current cycle and no messages to be received by the output port during a subsequent cycle, and the second power domain is to be power gated to a powered down state based on detection of an input port buffer being empty and the output port being not active.

22. The apparatus of claim 21, wherein the first power domain includes an output port domain and the second power domain includes an input port domain.

23. The apparatus of claim 22, wherein the input power domain comprises: a buffer, routing computation logic, and local arbitration logic, and the output power domain comprises a crossbar, global arbitration logic, and a link driver.

24. The apparatus of claim 21 wherein no activity in the output port for the current cycle comprises no activity in the switching fabric for the output port.

25. The apparatus of claim 21 wherein no messages are to be received by the output port during a subsequent cycle comprises determining that there are no arbitration wining ports requesting the output port.

26. The apparatus of claim 21 wherein the input buffer being empty comprises determining if there is activity in a read buffer for the input port.

27. The apparatus of claim 21 wherein the input buffer being empty comprises determining if there is activity in a write buffer for the input port.

28. The apparatus of claim 21 wherein determining the output port is not active comprises counting a number of cycles from a wakeup signal, wherein the number corresponds to an amount of time for the input port to transition out of the power-gated state.

29. The apparatus of claim 21 wherein the plurality of agents includes at least one processing core.

* * * * *